United States Patent
Leung et al.

(10) Patent No.: US 6,926,922 B2
(45) Date of Patent: Aug. 9, 2005

(54) PWB MANUFACTURE

(75) Inventors: Mei Kiu Leung, Shatin NT. (HK); Willetta Lai, Kowloon (HK); Pit Kai Peter Cheng, New Territories (HK); Cecilia Po Sze Wong, Chai Wan (HK)

(73) Assignee: Shipley Company, L.L.C., Marlborough, MA (US)

( * ) Notice: Subject to any disclaimer, the term of this patent is extended or adjusted under 35 U.S.C. 154(b) by 75 days.

(21) Appl. No.: 10/408,422

(22) Filed: Apr. 7, 2003

(65) Prior Publication Data

US 2004/0022934 A1 Feb. 5, 2004

Related U.S. Application Data

(60) Provisional application No. 60/371,287, filed on Apr. 9, 2002, and provisional application No. 60/371,282, filed on Apr. 9, 2002.

(51) Int. Cl.$^7$ .................................................. B05D 5/12
(52) U.S. Cl. .................... 427/96.1; 427/97.2; 427/97.7; 427/97.8; 427/97.9; 427/304; 427/307; 427/437
(58) Field of Search ................................ 427/96.1, 97.2, 427/97.7, 97.8, 97.9, 304, 307, 437, 96, 98, 123, 125, 309, 404

(56) References Cited

U.S. PATENT DOCUMENTS

| | | | | |
|---|---|---|---|---|
| 3,775,121 A | * | 11/1973 | Sharp | 430/311 |
| 4,975,159 A | | 12/1990 | Dahms | |
| 5,948,533 A | * | 9/1999 | Gallagher et al. | 428/418 |
| 6,284,309 B1 | * | 9/2001 | Bishop et al. | 427/98 |
| 6,533,849 B1 | * | 3/2003 | Fang | 106/1.23 |

FOREIGN PATENT DOCUMENTS

JP          2002-069656          3/2002

* cited by examiner

*Primary Examiner*—Brian K. Talbot
(74) *Attorney, Agent, or Firm*—S. Matthew Cairns

(57) ABSTRACT

A process and composition for manufacturing printed wiring boards that reduces or eliminates the problem of depositing electroless nickel in through holes that are not designed to be metal plated is provided. Also provided by the present invention is a method and composition for depositing a final finish that is even and bright. The present invention is particularly suitable for the manufacture of printed circuit boards containing one or more electroless nickel-immersion gold layers.

20 Claims, No Drawings

PWB MANUFACTURE

This application claims the benefit of U.S. Provisional Application Nos. 60/371,282, filed on Apr. 9, 2002, and 60/371,287, filed on Apr. 9, 2002.

BACKGROUND OF THE INVENTION

This invention relates generally to the field of printed wiring board manufacture. In particular, this invention relates to the manufacture of printed wiring boards having non-plated through holes.

The manufacturing process for a printed wiring board typically involves the formation and plating of through holes in a substrate. In a typical process, these plated through holes are formed by a sequence of steps including drilling, electroless metal plating such as electroless copper plating, resist application, electroplating of copper and a metal resist such as tin or tin-lead, resist stripping, copper etching and metal resist stripping.

The majority of holes in a printed wiring board substrate are designed to act as conductors for the passage of current from one side of the board to the other and are therefore to be plated with a conductive metal. However, a small number of through holes are instead designed for mechanical purposes such as for the attachment of devices to the finished board or attachment of the finished board to a sub-assembly. In such cases, the through holes must often conform to strict dimensional tolerances which may be difficult to maintain if the hole is plated. Designers of printed wiring boards often choose to have such holes be free of plated metal and to achieve the dimensionality target by drilling the hole at a desired diameter.

During electroless copper plating of the printed wiring board substrate, an electroless copper plating catalyst such as palladium colloid is first applied to the substrate. Such catalyzed substrate is then subjected to an electroless copper plating bath. A thin copper layer is then electrolessly plated on all surfaces of the substrate exposed to the plating catalyst, including the through holes designed not to be plated. In a pattern plating process of manufacturing printed wiring boards, a resist, such as a dry film plating resist, is then applied to the substrate in such a way that such holes are covered by the resist film. With dry film resists, such process is often referred to as "tenting." The dry film resist is effective in preventing copper from being deposited into such holes during subsequent electrolytic deposition of copper. When such resist is later removed, the thin electroless copper deposit in the holes is readily removed by a subsequent etching step. In a panel plating manufacturing process, a thick copper layer is electrolytically deposited over the entire surface of the substrate. A resist layer is then applied and imaged. Copper on areas that are not designed to have a copper trace, including certain through holes, is then removed by etching.

Once a printed wiring board has reached the stage in the manufacturing process where the through holes designed to be plated have been metal plated and the surface patterns created (i.e. a circuitized board or substrate), a selective permanent resist (i.e. a solder mask) is typically applied. A soldermask leaves open areas of the printed wiring board to which electrical components will be attached, such as by soldering or wirebonding. Additional coatings are often applied to the exposed copper features to facilitate subsequent assembly steps. One such coating is nickel or nickel-gold. Nickel-gold coatings typically consist of a layer of electroless nickel followed by a thin layer of gold which is typically immersion plated onto the nickel layer. Such nickel-gold layer possesses excellent solderability and shelf life characteristics. Such electroless nickel-immersion gold is often referred to as "ENIG."

While such ENIG process is designed to plate solely on the exposed copper features of the printed wiring board substrate, a common problem encountered is that electroless nickel plating may begin in the through holes that are designed not to be plated. While not intending to be bound by theory, it is believed that such electroless nickel plating results from traces of electroless copper plating catalyst, such as palladium colloidal catalyst, left on the hole wall or on traces of copper that the etching process failed to completely remove from the barrel of the hole. Electroless metal plating baths other than nickel can also suffer from metal deposition in the through holes that are not designed to be plated. The formation of such undesired electroless metal deposit, which either partly or completely covers the walls of the holes designed to remain "unplated", is undesirable both functionally and cosmetically.

In an attempt to prevent the electroless nickel plating of such holes, conventional printed wiring board manufacturing methods include the sequential steps of contacting the printed wiring board substrate with a cleaner, a hole conditioner and a microetch prior to the electroless metal deposition process steps. Cleaners are typically acid or alkaline baths containing surfactants and optionally chelating agents. Such cleaners remove organic contaminants such as grease, oil and fingerprints as well as copper oxidation and debris in the through holes. Hole conditioners are typically sulfur containing organic compounds such as thiosulfate or thiourea which are used to "poison" any electroless catalysts remaining in through holes that are not to be plated. However, such sequential process is not completely effective in preventing the electroless metal plating, and particularly electroless nickel plating, of such through holes and may also have adverse effects on subsequent ENIG plating steps.

When conditioners containing alternatives to thiourea or thiosulfate are used, or when processes that avoid such conditioners altogether are used, the resulting ENIG deposit is often uneven and has a matte finish. Neither of these characteristics is desirable.

There is a need for a process of manufacturing a printed wiring board such that through holes that are designed to remain unplated are not plated with electroless nickel. There is also a need for a process of manufacturing a printed wiring board where final finishes, such as ENIG, are even and bright, particularly when processes free of thiourea or thiosulfate or containing reduced amounts of thiourea are used.

SUMMARY OF THE INVENTION

It has been surprisingly found that the undesired electroless metal plating of through holes not designed to be plated can be effectively reduced or eliminated according to the present invention. Such reduction or elimination of electroless metal plating in such through holes can be effectively accomplished with fewer steps than conventional printed wiring board manufacturing processes.

It has also been surprisingly found that final finishes, particularly an ENIG final finish, can be provided that are even and bright. Such even and bright deposits can be obtained particularly when no catalyst-poisoning conditioner is used, or when such conditioner is free of thiourea or thiosulfate. These finishes can be achieved according to the present invention without increasing the number of steps.

The present invention provides a method for manufacturing a printed wiring board including the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a cleaning bath; and (ii) contacting the cleaned printed wiring board substrate with a microetching bath; and c) electrolessly depositing a metal layer on the printed wiring board substrate; wherein the cleaning bath includes one or more organic sulfur compounds containing a divalent sulfur atom having a carbon-sulfur single bond.

The present invention further provides a method of reducing electroless metal deposition in through holes that are not to be plated including the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a cleaning bath; and (ii) contacting the cleaned printed wiring board substrate with a microetching bath; and c) electrolessly depositing a metal layer on the printed wiring board substrate; wherein the cleaning bath includes one or more organic sulfur compounds containing a divalent sulfur atom having a carbon-sulfur single bond.

The present invention also provides a composition particularly suitable for cleaning through holes that are designed not to be plated, the composition including water, one or more surfactants and one or more organic sulfur compounds containing a divalent sulfur atom having a carbon-sulfur single bond. Such compositions may be alkaline or acidic and may optionally include one or more chelating agents.

The present invention still further provides a method of preventing electroless metal deposition on a substrate including the step of contacting the substrate with the cleaning composition described above. An advantage of the present invention is that the use of a thiourea-containing organic compound (i.e. a conventional hole conditioning step) can be reduced or eliminated in the treatment of through holes that are not to be plated.

Also provided by the present invention is a method for manufacturing a printed wiring board including the steps of: a) providing a printed wiring board substrate having a portion of which is to be electrolessly plated with a metal layer; b) contacting the printed wiring board substrate with a microetching bath prior to electroless metal plating; and c) contacting the printed wiring board substrate with an electroless metal plating bath; wherein the microetching bath includes one or more complexing agents selected from hydantoin compounds, organic sulfonic acids and mixtures thereof.

In addition, the present invention provides a method for manufacturing a printed wiring board including the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a cleaning bath; and (ii) contacting the cleaned printed wiring board substrate with a microetching bath; and c) electrolessly depositing a metal layer on the printed wiring board substrate; wherein the cleaning bath includes one or more organic sulfur compounds containing a divalent sulfur atom having a carbon-sulfur single bond; and wherein the microetching bath includes one or more complexing agents selected from hydantoin compounds, organic sulfonic acids and mixtures thereof.

Still further provided by the present invention is a composition, particularly suitable for providing even and bright electroless metal deposits, the composition including water, one or more oxidants, and one or more complexing agents selected from hydantoin compounds, organic sulfonic acids and mixtures thereof. Such compositions may optionally contain one or more other additives.

DETAILED DESCRIPTION OF THE INVENTION

As used throughout this specification, the following abbreviations shall have the following meanings, unless the context clearly indicates otherwise: ° C.=degrees Centigrade; ° F.=degrees Fahrenheit; g=gram; L=liter; mL=milliliter; and PWB=printed wiring board.

The terms "halogen" and "halo" include fluorine, chlorine, bromine, and iodine. Thus the term "halogenated" refers to fluorinated, chlorinated, brominated, and iodinated. The terms "depositing" and "plating" are used interchangeably throughout this specification. The terms "printed wiring board" and "printed circuit board" are used interchangeably throughout this specification. "Microetch" refers to an etching step that does not form features. Such microetch does not remove the full amount of a copper layer, rather it provides a freshened surface (e.g. where copper oxide has been removed) and/or a textured surface. The term "circuitized" refers to a printed wiring board substrate having defined copper features thereon. "Printed circuit board" and "printed wiring board" are used interchangeably throughout this specification. As used throughout this specification, "printed wiring board substrate" refers to any substrate used in the manufacture of a printed wiring board, such as innerlayers and outerlayers. The term "alkyl" includes linear, branched and cyclic alkyl. Likewise, the term "alkenyl" includes linear, branched and cyclic alkenyl. A "heterocyclic" compound refers to a cyclic compound having one or more heteroatoms within the ring structure.

All amounts are percent by weight and all ratios are by weight, unless otherwise noted. All numerical ranges are inclusive and combinable in any order, except where it is clear that such numerical ranges are constrained to add up to 100%.

Circuitized printed wiring board substrates useful in the present invention may be prepared by a variety of methods, such as panel plating and pattern plating. Both panel plating and pattern plating are well known to those skilled in the art. For example, such methods are described in *Printed Circuits Handbook*, C. F. Combs, Jr., ed., 4$^{th}$ edition, McGraw-Hill, 1996, for example at pages 19.20–19.22. The printed wiring board substrates useful in the present invention typically contain through holes, wherein at least a portion of the through holes are designed not to be plated (i.e. they are not designed to form plated through holes or "PTHs"). It will be appreciated by those skilled in the art that a substrate may contain only through holes designed not to be plated, such as, for example, substrates suitable for use in sequential build applications. In other embodiments, printed wiring board substrates may contain through holes that are not to be plated in addition to through holes that are to be plated.

Typically, in such circuitization processes, through holes are added to the substrate, such as by drilling. Such through holes are typically then subjected to desmear, swelling and etching steps to prepare the through holes for electroless plating. Prior to electroless plating, the through holes are subjected to a catalyst composition, such as palladium, with or without a tin colloid, to catalyze the electroless deposition of the conductive metal, typically copper. Following such catalyst treatment, the substrate is subjected to electroless metal plating. During such plating step, all the through holes in the substrate are typically plated with the metal. Subsequent to such plating step, a resist, such as a dry film resist, is typically applied to the substrate and openings are imaged in the resist over the areas, including through holes, that are not to be plated. The metal is then removed from the areas, including the through holes that are not to be plated, exposed through the openings in the resist. Such metal removal is generally achieved by etching away the meal, which defines the lines and traces on the substrate. In this way, the substrate is circuitized. Through holes that are to remain plated are generally protected from such etching treatment by the resist, which "tents" over such through holes.

Following circuitization, the printed wiring board substrate may be rinsed, such as with water, solvent, or solvent-water mixtures, and then optionally dried, prior to contact with the cleaning or first microetching step of the present invention.

Printed wiring boards having through holes which are not designed to be plated and which remain substantially unplated during or after electroless metal deposition are manufactured according the present invention which includes the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a cleaning bath; and (ii) contacting the cleaned printed wiring board substrate with a microetching bath; and c) electrolessly depositing a metal layer on the printed wiring board substrate; wherein the cleaning bath includes one or more organic sulfur compounds containing a divalent sulfur atom having a carbon-sulfur single bond. Typically, the substrate contains a plurality of through holes. The term "a portion of the through holes" refers to some number of through holes that is less than the total number of through holes contained within the substrate.

In an alternate embodiment, the printed wiring board substrate may be contacted with a first microetching bath prior to cleaning. In this embodiment, the present invention provides a method for manufacturing a printed wiring board comprising the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a first microetching bath to provide a microetched printed wiring board substrate; (ii) contacting the microetched printed wiring board substrate with a cleaning bath; and (iii) contacting the cleaned and microetched printed wiring board substrate with a second microetching bath; and c) electrolessly depositing a metal layer on the printed wiring board substrate. In this alternate embodiment, the cleaning bath does not require the presence of the organic sulfur compound containing a divalent sulfur atom having a carbon-sulfur single bond. Rather, the presence of the two microetching steps, one prior to and the other after the cleaning step, in combination with the cleaning step are effective in preventing unwanted plating of certain through holes in certain applications. However, the use of organic sulfur compound in the cleaning bath is preferred. The first and second mircoetching baths may be the same or different. Any of the microetching baths described below are suitable for either the first or second microetching bath or for both baths.

Cleaning baths are typically used to remove organic contaminants such as grease, oil and fingerprints, copper oxidation as well as debris in the through holes. A wide variety of cleaning baths may be suitably used in the present invention provided that they include one or more organic sulfur compounds containing a divalent sulfur atom having a carbon-sulfur single bond. Such cleaning baths may be alkaline or acidic, and are preferably acidic, and typically contain water, one or more surfactants, and optionally one or more chelating agents in addition to the certain organic sulfur compounds. Suitable chelating agents include monodentate and multidentate ligands. A number of such cleaning baths are commercially available, typically as a concentrate, from a variety of sources. In general, such commercially available concentrates are diluted with water in a variety of amounts, such as 150 to 300 mL/L and preferably from 200 to 300 mL/L. The printed wiring board substrate may be contacted with the cleaning solution by any of a variety of means, such as spraying, dipping, flooding, and the like. The choice of such contacting means will depend upon whether a vertical or horizontal plating line is used. Any of the foregoing means are suitable and none are preferred. Optionally, the printed wiring board substrate may be rinsed and dried following the cleaning step. Any of the above described rinsing procedures are suitable.

A wide variety of organic sulfur compounds may be used in the present cleaning compositions, provided that such compounds contain a divalent sulfur atom having a carbon-sulfur single bond. Suitable organic sulfur compounds include, but are not limited to, thiol-substituted organic compounds such as thiol-substituted alkane carboxylic acids such as thioglycolic acid, thiomalic acid and penicillamine; thiol-substituted alkanes and alkenes; thiol-substituted aromatic compounds such as mercaptobenzothiazole, mercaptotriazole, mercaptopyridine, mercaptobenzene, mercaptotoluene and the like; thioethers such as dialkyl- and diaryl-thioethers; and disulfides such as dialkyl- and diaryl-disulfides. Particularly useful thio-substituted organic compounds include thio-substituted heterocyclic compounds such as thio-substituted heteroaromatic compounds. Thiol-substituted organic compounds and thioethers are preferred. Such organic sulfur compounds may be further substituted. By "substituted" it is meant that one or more alkyl, alkenyl or aromatic hydrogen atoms are replaced with one or more substituent groups. Suitable substituent groups include, but are not limited to, hydroxy, $(C_1-C_{12})$alkoxy, amino, $(C_1-C_{12})$alkylamino, di$(C_1-C_{12})$alkylamino, and the like. Preferably, the alkyl and alkenyl groups contain from 1 to 20 carbon atoms, and preferably from 2 to 20 carbon atoms, i.e. $(C_2-C_{20})$. It is further preferred that the present organic sulfur compounds are free of thio-urea linkages (i.e. RNH—C(S)—HNR') or thio-amide (i.e. RNH—C(S)—R') linkages or both. In another embodiment, the organic sulfur compound is free of thiocarbonyl linkages. Such organic sulfur compounds are generally commercially available from a variety of sources, such as Aldrich, Milwaukee, Wis.

The organic sulfur compounds may be used in the cleaning compositions in a wide range of amounts. Typically, the organic sulfur compounds are used in an amount of from 0.05 to 25 mL/L, preferably from 0.1 to 15 mL/L, more preferably from 0.1 to 10 mL/L and still more preferably from 0.2 to 8 mL/L. Higher or lower amounts of the organic sulfur compounds may be suitably used. The specific amount of organic sulfur compound used depends upon the particular organic sulfur compound selected and the particular cleaning bath employed.

In certain instances, it is desirable to use a cleaning composition containing a combination of one or more of the above described organic sulfur compounds with thiourea. For example, when the present cleaning and microetching steps are performed after a metal resist stripping step and before a soldermask application step, thiourea is not needed in the present cleaning baths. However, if the present cleaning and microecthing steps are performed after soldermask application and heat curing, the use of thiourea in the present cleaning compositions is preferred. When thiourea is used in the present cleaning baths, it is typically used in an amount of 0.5 to 15 g/L, more typically from 1 to 10 g/L and even more typically from 4 to 6 g/L.

A wide variety of surfactants may optionally be used in the present cleaning baths. Such surfactants are typically nonionic or anionic, but other types may be used. Suitable nonionic surfactants include, without limitation: poly (alkylene oxide) polymers such as poly(ethylene oxide), poly(propylene oxide), poly(butylenes oxide) and copolymers thereof, poly(arylene oxide) such as poly(styrene oxide); and the like. Particularly useful poly(alkylene oxide) copolymers are those containing two or more ethylene oxide ("ED"), propylene oxide ("PO") or butylenes oxide monomers.

Exemplary EO/PO copolymers are those having the formula HO—(A)$_n$—(B)$_m$—H wherein each of A and B are selected from ethyleneoxy and propyleneoxy groups provided that A and B are different; and n and m are the number of A and B repeat units, respectively, in the copolymer. "Ethyleneoxy" refers to moieties having the formula —(CH$_2$—CH$_2$—O)—. "Propyleneoxy" refers to moieties having the formula —(CH(CH$_3$)—CH$_2$—O)— or —(O—CH(CH$_3$)—CH$_2$)—. Typically, n is in the range of 1 to 250 and specifically 10 to 170. Typically, m is in the range of 1 to 250 and specifically 10 to 90. Particularly useful EO/PO copolymers are those having the formula HO(CH$_2$CH$_2$O)$_x$(CH$_2$CHCH$_3$O)$_y$H. In general, the ratio of x:y is from 10:90 to 95:5 and specifically from 50:50 to 75:25. It will be appreciated by those skilled in the art that the solubility of such EO/PO copolymers can be adjusted by changing the number of EO groups, PO groups or both groups.

Such poly(alkylene oxide) copolymers may be linear or star-shaped copolymers. Such star copolymers are poly(alkylene oxide) random copolymers having 3 or more terminal hydroxyl groups. In general, each arm of the star shape terminates in a hydroxyl group. Typically, such star random copolymers have 3 or 4 terminal hydroxyl groups, although copolymers having a greater number of terminal hydroxyl groups may be employed.

Other suitable wetting agents include, but are not limited to: relatively low molecular weight ethylene oxide ("EO") derivatives of aliphatic alcohols containing an alkyl group of up to 7 carbons or ethylene oxide derivatives of aromatic alcohols having up to two aromatic rings, which may be fused and which may be substituted with an alkyl group having up to 6 carbons. The aliphatic alcohols may be saturated or unsaturated. The aromatic alcohols typically have up to 20 carbon atoms prior to derivatization with ethylene oxide. Such aliphatic and aromatic alcohols may be further substituted, such as with sulfate or sulfonate groups. Suitable wetting agents include, but are not limited to: polystyrenated phenol with 12 moles of EO, butanol with 5 moles of EO, butanol with 16 moles of EO, butanol with 8 moles of EO, octanol with 12 moles of EO, beta-naphthol with 13 moles of EO, bisphenol A with 10 moles of EO, sulfated bisphenol A with 30 moles of EO and bisphenol A with 8 moles of EO.

Any anionic surfactant is suitable for use in the present invention. Particularly suitable anionic surfactants are those containing one or more alkylene oxide or arylene oxide groups and one or more sulfonate or phosphate groups, such as a sulfonated or phosphated version of any of the above nonionic surfactants. Sulfonated poly(alkylene oxide) polymers are particularly suitable for certain applications.

In certain applications such as when the printed wiring board is cleaned after soldermask application, the use of a surfactant in the cleaning bath helps to provide an even electroless metal deposit during subsequent plating. When present, such surfactants are typically used in an amount of 0.05 to 10 g/L, more typically from 0.1 to 5 g/L and even more typically from 0.1 to 2 g/L.

The present cleaning compositions may be used at a variety of temperatures, such as from about 20° below room temperature to about 10° below the flash point or boiling point (whichever is lower) of the composition.

When the cleaning bath employed contains one or more organic sulfur compounds containing a divalent sulfur atom having a carbon-sulfur single bond, the first microetching step is optional. When the cleaning bath does not employ such organic sulfur compounds, then the first microetching step is required. When the first microetching step is required, then the second microetching step is optional, but preferred. The second microetching step is required when the cleaning bath contains one or more organic sulfur compounds containing a divalent sulfur atom having a carbon-sulfur single bond.

Suitable microetching baths contain one or more oxidants, water and optionally one or more other additives. Suitable oxidants include, but are not limited to, nitrite salts, persulfate salts, chlorite salts, chlorate salts, peroxyphosphate salts, perchlorate salts, peroxides, iodate salts, hypochlorite salts, perborate salts, periodate salts, bromate salts, nitrate salts, oxygen, chlorine dioxide, and the like. Preferred oxidants include periodate salts, perborate salts, peroxides, persulfate salts including peroxymonosulfate salts, and peroxyphosphate salts, and more preferably persulfate salts. Particularly suitable salts include the alkali and alkaline earth salts of any of the foregoing, and more particularly sodium and potassium salts, and still more particularly potassium. The oxidant is typically present in the microetching bath in an amount of from 1 to 700 g/L and depends upon the particular oxidant selected. For example, when the oxidant is potassium persulfate or potassium peroxymonosulfate, it is preferably present in an amount of from 5 to 300 g/L, more preferably from 5 to 250 g/L, and still more preferably from 10 to 100 g/L. When the oxidant is sodium persulfate, it is preferably present in an amount up to 600 g/L, and preferably up to 500 g/L, and more preferably up to 480 g/L.

The microetching baths optionally contain one or more complexing agents selected from hydantoin compounds and organic sulfonic acids. Any hydantoin compound that is soluble in the microetching bath may be used. Suitable hydantoin compounds include, but are not limited to: hydantoin; mono($C_1$–$C_{10}$)alkylhydantoins; di($C_1$–$C_{10}$) alkylhydantoins such as 5,5-dimethylhydantoin, 5,5-diethylhydantoin, 5,5-dibutylhydantoin and 5-ethyl-5-methylhydantoin; 5-hydantoincarboxylic acids such as 5-hydantoinacetic acid; ($C_6$–$C_{10}$)arylhydantoins such as 5-(4-hydroxybenzyl)hydantoin, 1-(3,4-dichlorophenyl)-5-imino-3-(p-tolyl)hydantoin, 1-(3,5-dichlorophenyl)-5-imino-3-(p-tolyl)hydantoin, 1-(3-chlorophenyl)-5-imino-3-(p-tolyl)hydantoin and 5-(4-(dimethylamino)benzylidene) hydantoin.

In general, the hydantoin compounds are present in the microetching bath in an amount of from 0.05 to 25 g/L, preferably from 0.1 to 15 g/L and more preferably from 1 to 10 g/L. The hydantoin compounds are generally commercially available, such as from Aldrich, Milwaukee, Wis., or may be prepared by methods known in the literature. Such compounds may be used as is without further purification.

Any organic sulfonic acid may be used in the present microething baths provide it functions as a complexing agent. Suitable organic sulfonic acids include, without limitation, alkane sulfonic acids such as methane sulfonic acid, ethane sulfonic acid and propane sulfonic acid, and aryl sulfonic acids such as tolyl sulfonic acid, phenyl sulfonic acid, phenol sulfonic acid and dihydroxybenzene sulfonic acid. Hydroxy-substituted aryl sulfonic acids are particularly suitable.

In general, the organic sulfonic acids are present in the microetching baths in an amount of from 0.05 to 25 g/L, typically from 0.5 to 15 g/L. The organic sulfonic acids are generally commercially available or may be prepared by methods known in the literature.

The complexing agents for the present microetching baths may be composed of one or more hydantoin compounds, one or more organic sulfonic acid compounds or a mixture of one or more hydantoin compounds with one or more organic sulfonic acids. For certain applications, such as when the printed wiring board is cleaned and microetched before the application of a soldermask, the complexing agents are not needed in the microetching bath. However, it is still preferred to have one or more hydantoin compounds in such microetching bath. For other applications, such as following soldermask application and heat curing, it is preferred that one or more complexing agents be used in the microetching bath in order to provide an even electroless metal deposit. If a matte electroless metal deposit is desired, it is preferred that one or more organic sulfonic acids, particularly hydroxy-substituted aryl sulfonic acids, be used. For a bright electroless metal deposit, it is preferred that one or more hydantoin compounds are used as complexing agents in the microetching bath.

Optional additives in the microetching bath include one or more of surfactants, acids, bath stabilizers, salts, and the like. The amount of such optional additive is any amount up to about 100 g/L, depending upon the particular additive chosen. The choice of optional microetching bath additive and its amount are well within the ability of one skilled in the art.

The temperature of the microetching bath may vary across a wide range such as from 10° to 50° C. The substrates are contacted with the microetching bath for a period of time from 3 seconds to 15 minutes. The specific time will depend upon the particular oxidant selected, the concentration of the oxidant in the bath, and the size and number of through holes present.

The printed wiring board substrate may be contacted with the microetching solution by any of a variety of means, such as spraying, dipping, flooding, and the like. The choice of such contacting means will depend upon whether a vertical or horizontal plating line is used. Any of the foregoing means are suitable and none are preferred.

Optionally, the printed wiring board substrate may be rinsed and dried following the microetching step.

A wide variety of metals may be electrolessly deposited according to the present invention. Suitable metals include, but are not limited to, copper, palladium, nickel, silver and alloys and mixtures thereof. Preferred metals are nickel, palladium and alloys and mixtures thereof, and more preferably nickel. Typical electroless metal plating baths useful in the present invention include one or more metal salts, one or more reducing agents, optionally one or more chelating agents and optionally one or more additives. Such plating baths are typically aqueous.

Suitable metal salts include are any which are water-soluble or capable of forming a soluble species either alone or in combination with a chelating agent. Such metal salts include, but are not limited to, metal halides, metal chlorates, metal acetates, metal citrates, metal sulfonates, metal tartrates, metal nitrates, metal sulfates, metal sulfamates, metal alkylsulfonates, metal arylsulfonates, metal fluoroborates, metal gluconates, metal acetates, metal formates and the like. The amount of such metal salts present in the electroless plating baths depends upon the particular metal salt and electroless bath used. Such amounts are within the ability of one skilled in the art and are typically sufficient to provide an amount of metal (zerovalent metal) in the range of from 1 to 100 g/L, preferably from 1 to 25 g/L, and more preferably from 1 g/L to 7 g/L.

A wide variety of reducing agents may be used in the electroless baths. Suitable reducing agents include, but are not limited to, hypophosphites such as sodium hypophosphite potassium hypophosphite and nickel hyposphite, sodium borohydride, formaldehyde, dimethylamine borane, trimethylamine borane, methylmorpholino borane, morpholino borane, diisopropylamine borane, L-sodium ascorbate, phosphites such as sodium phosphite and potassium phosphite, tartaric acid, glucose, glycerine, sodium N,N-diethylglycine, sodium formate, potassium formate, titanium trichloride, hydrazine, thiourea, methylthiourea, N-methylthiourea, N-ethylthiourea, hydroquinone, bivalent cobalt compounds, and the like. For electroless nickel plating, the preferred reducing agents include nickel hypophosphite, sodium hypophosphite, potassium hypophosphite and dimethylamine borane. The specific reducing agent depends upon the particular metal to be plated and the particular electroless bath formulation selected. The amount of such reducing agent in the electroless bath is well known to those skilled in the art and depends upon the particular reducing agent selected and whether the electroless bath is a fast or slow electroless metal plating bath. For example, when formaldehyde is used as the reducing agent in an electroless copper plating bath, it is typically used in the range of from 1 to 15 g/L and preferably from 6 to 12 g/L. In electroless nickel baths, sodium hypophosphite is typically used in an amount form 10 to 60 g/L and preferably from 15 to 40 g/L.

A wide variety of chelating agents may be suitably used in the present invention. The choice of chelating agent as well as the amount of such chelating agent is well within the ability of those skilled in the art. Suitable chelating agents include, but are not limited to, carboxylic acids such as $(C_1-C_{20})$alkyl carboxylic acids, $(C_1-C_{20})$alkyl dicarboxylic acids, $(C_1-C_{20})$alkyl tricarboxylic acids, hydroxy$(C_1-C_{20})$ alkyl carboxylic acids, hydroxy$(C_1-C_{20})$alkyl dicarboxylic acids, hydroxy$(C_1-C_{20})$alkyl tricarboxylic acids, and the like; aminoacids such as glycine, alanine, and the like; alkyleneamines such as ethylenediamine, diethylenetriamine, and triethylenetetraamine; ethylenediaminetetraacetic acid ("EDTA"); tetramethylenediamine, citrate salts; tartrate salts such as Rochelle salts; and the like. Optional additives that may be used in the present electroless baths include, but are not limited to, brighteners, suppressors, leveling agents, wetting agents, and the like. The choice of and amount of such additives is well within the ability of those skilled in the art.

The present electroless metal plating baths may further include one or more alloying or co-plating components. Such alloying or co-plating components are typically added to the electroless plating bath as a salt. Suitable alloying or co-plating components include, but are not limited to, salts of other metals such as cobalt, tungsten, zinc, tin, copper and the like. The amount of such alloying or co-plating components are well within the ability of those skilled in the art.

In general, the pH of the electroless plating baths may vary over a wide range, such as from 4 to 13. The specific pH will depend upon the particular electroless metal bath chosen. For example, electroless copper baths are preferably alkaline. Thus, such copper electroless baths typically contain one or more bases. Suitable bases include alkali metal hydroxides, ammonium hydroxides, tetra$(C_1-C_4)$ alkylammonium hydroxides and the like. Preferred bases include sodium hydroxide, potassium hydroxide, lithium hydroxide and tetramethylammonium hydroxide. Such bases are added to the electroless copper plating baths in sufficient amounts to provide the desired alkalinity. Typically, such bases are added in amounts sufficient to provide a pH in the range of from about 7.5 to about 14, preferably from about 8 to about 13.5, and more preferably from about 8.5 to about 13. Electroless nickel baths suitable have a pH in the range of 4 to 13, and preferably have a pH of from 4 to 6.

The electroless metal plating baths are typically used at a temperature from room temperature to 200° F. (93° C.), preferably from 70° to 190° F. (21° to 88° C.). The temperature of such plating bath is selected such that sufficient metal is deposited within the desired time without substantially adversely affecting certain parts of the substrate, particularly organic components of the substrate such as soldermask.

It will be appreciated by those skilled in the art that a catalyst treatment may be used to prepare the substrate for electroless metal deposition. The choice of such catalyst is well within the ability of those skilled in the art. For example, when nickel is to be electrolessly deposited, a catalyst, preferably a palladium catalyst, is used to treat the substrate prior to contact with the electroless nickel bath. Any conventional electroless catalyst treatment suitable for the metal to be deposited may be used.

A second metal layer, and optionally a third or more layers, may be deposited on the electrolessly deposited metal layer. Such second metal layer, or third or more metal layers, may be deposited by electroless plating or by immersion plating Thus the substrates and printed wiring boards of the present invention may contain more than one electroless metal deposits or a combination of one or more electroless metal deposits with one or more immersion deposits. Thus, following electroless metal deposition, the printed wiring board substrate may then be contacted with a second electroless metal plating bath or an immersion plating bath. Following contact with a second electroless plating bath, the printed wiring board substrate may then further be contacted with an immersion plating bath. Suitably deposited metal layers on the printed wiring board substrate include, but are not limited to, electroless, electroless-electroless, electroless-immersion and electroless-electroless-immersion. Suitable second metals deposited on the electrolessly deposited metal layers include, but are not limited to, palladium, gold and alloys and mixtures thereof. Particularly suitable metal layers deposited on the printed wiring board substrate of the present invention include electroless nickel, electroless nickel-immersion gold ("ENIG"), electroless nickel-electroless palladium-immersion gold, electroless nickel-electroless gold, electroless nickel-electroless palladium, electroless nickel-immersion palladium, electroless silver; and electroless palladium.

Particularly suitable printed wiring board methods of the present invention include contacting the printed wiring board substrate with an electroless nickel bath; an electroless nickel bath followed by contact with an electroless palladium bath; an electroless nickel bath followed by contact with an immersion gold bath; an electroless nickel bath followed by contact with an electroless palladium bath followed by contact with an immersion gold bath; an electroless nickel bath followed by contact with an immersion palladium bath; and an electroless nickel bath followed by contact with an electroless gold bath.

Suitable immersion plating baths are well known to those skilled in the art. Any conventional immersion plating bath capable of depositing the desired metal on the electrolessly plated metal layer is suitable. Immersion gold plating baths are preferred. Exemplary immersion gold plating baths are those disclosed in U.S. Pat. No. 5,803,957, although various other immersion gold plating baths may be used.

The present invention further provides a method of reducing electroless metal deposition in through holes that are not to be plated including the steps of: a) providing a circuitized printed wiring board substrate having through holes wherein a portion of the through holes are not to be metal plated; b) subjecting the printed wiring board substrate to the sequential steps of: (i) contacting the printed wiring board substrate with a cleaning bath; and (ii) contacting the cleaned printed wiring board substrate with a microetching bath; and c) electrolessly depositing a metal layer on the printed wiring board substrate; wherein the cleaning bath includes one or more organic sulfur compounds containing a divalent sulfur atom having a carbon-sulfur single bond.

An advantage of the present invention is that printed wiring board substrates having through holes which are not designed to be plated remain substantially unplated after such electroless metal deposition. A further advantage is that the use of thiourea in the treatment of through holes that are not to be plated can be reduced or eliminated. When cleaning baths containing a combination of thiourea and one or more organic sulfur compounds containing a divalent sulfur atom having a carbon-sulfur single bond are used, such baths are more effective at preventing undesired through hole plating than are conventional baths containing only thiourea.

In an alternate embodiment, substrates having even and bright electrolessly deposited final finishes are provided. Such even and bright final finishes are achieved by the use of a microetching composition containing one or more hydantoin compounds. The present process provides even and bright final finishes without any additional process steps in the manufacturing process. In a further embodiment, substrates having even and matte electrolessly deposited final finishes are provided. Such even and matte final finishes are achieved by the use of a microetching composition containing one or more organic sulfonic acids.

Accordingly, the present invention provides a method for manufacturing a printed wiring board including the steps of: a) providing a printed wiring board substrate having a portion of which is to be electrolessly plated with a metal layer; b) contacting the printed wiring board substrate with a microetching bath prior to electroless metal plating; and c) contacting the printed wiring board substrate with an electroless plating bath; wherein the microetching bath includes one or more complexing agents selected from one or more hydantoin compounds and one or more organic sulfonic acids. Preferably, the printed wiring board substrate is cleaned prior to the microetching step.

Although the present invention has been described in terms of printed wiring board manufacture, the present invention may also be advantageously used in the manufacture of a variety of electronic or opto-electronic devices. Suitable electronic or opto-electronic devices include, without limitation, integrated circuit packaging interconnects, waveguides, and optical interconnects. Accordingly, the present invention may be used to deposit bright and even electroless metal layers on an electronic or opto-electronic device substrate including the steps of: a) contacting the electronic or opto-electronic device substrate with a microetching bath prior to electroless metal plating; and b) contacting the electronic or opto-electronic device substrate with an electroless metal plating bath, wherein the microetching bath includes one or more hydantoin compounds.

The following examples are intended to illustrate further various aspects of the present invention, but are not intended to limit the scope of the invention in any aspect.

EXAMPLE 1 (COMPARATIVE)

Bare copper laminate printed wiring board substrates having through holes that were not to be plated were pre-treated with the conventional sequential steps of cleaning, hole conditioning and microetching prior to electroless nickel plating. The cleaning step was achieved by contacting the substrates with a commercially available cleaner. Following cleaning, the through holes in the substrates were contacted with a commercially available alkaline hole conditioner containing sodium thiosulfate. Following hole conditioning, the substrates were contacted with either Microetch A or B. Microetch A contained 100 g/L sodium persulfate and 2% sulfuric acid in water. Microetch B contained 100 g/L potassium peroxymonosulfate and 2% sulfuric acid in water. Next, a nickel layer was electrolessly deposited on the substrates, using a commercially available electroless nickel bath. After nickel deposition, the substrates were evaluated for nickel plating in the through holes that were not to be plated. Also, the substrates were evaluated for any affects of the process on the appearance of the substrates. The results are reported in Table 1.

TABLE 1

| Microetch | Nickel Plated in Through Holes | Substrate Appearance |
|---|---|---|
| A | No | Blackening of the substrate |
| B | No | Blackening of the substrate |

The above data clearly show that conventional pretreatment steps prior to electroless nickel plating are adequate at preventing nickel from depositing in through holes that are designed not to be plated, however such conventional processing provides blackened substrate surfaces which are cosmetically undesirable, and which may adversely affect subsequent processing of the substrate.

EXAMPLE 2 (COMPARATIVE)

The procedure of Example 1 was repeated using another bare copper laminate printed wiring board substrate having through holes that were not to be plated, however, the hole conditioning step was omitted. Thus, the substrate was first cleaned using a commercially available cleaner and then contacted with Microetch A. After microetching, the substrate was contacted with the electroless nickel bath of Example 1. Upon evaluation, it was found that the through holes that were designed not to be plated had been electrolessly plated with nickel.

Thus, it can be seen that the conventional process with the hole conditioner step omitted, i.e. a process including first cleaning followed directly by microetching, failed to prevent nickel from plating in the through holes that were not designed to be plated.

EXAMPLE 3

Bare copper laminate printed wiring board substrates having through holes that were not to be plated were pre-treated with the sequential steps of the invention, i.e. microetching, cleaning, and optionally a second microetching, prior to electroless nickel plating. The microetch baths tested are reported in Table 2.

TABLE 2

| Microetch | Formulation |
|---|---|
| A | 100 g/L sodium persulfate, 2% $H_2SO_4$, water |
| B | 100 g/L potassium peroxymonosulfate, 2% $H_2SO_4$, water |
| C | 20 g/L potassium peroxymonosulfate |
| D | 20 g/L potassium peroxymonosulfate, 5 g/L copper sulfate |
| E | 20 g/L potassium peroxymonosulfate, 10 g/L copper sulfate |
| F | 20 g/L potassium peroxymonosulfate, 2% $H_2SO_4$, 15 g/L copper sulfate |

The substrates were sequentially contacted with a microetch bath, removed from the microetch bath and cleaned using a commercially available cleaner, and contacted with a second microetch bath. No thiourea hole conditioning step was employed. Next, a nickel layer was electrolessly deposited on the substrates, using the commercially available electroless nickel bath from Example 1. After nickel deposition, the substrates were evaluated for nickel plating in the through holes that were not to be plated. Also, the substrates were evaluated for any affects of the process on the appearance of the substrates. The results are reported in Table 3.

TABLE 3

| Sample | Microetch | Second Microetch | Nickel Plated in Through Holes | Substrate Appearance |
|---|---|---|---|---|
| 1 | B | A | No | Substrate returned to white |
| 2 | C | A | No | Substrate returned to white |
| 3 | D | A | No | Substrate returned to white |
| 4 | E | A | No | Substrate returned to white |
| 5 | F | A | No | Substrate returned to white |

From the above data it can be clearly seen that the sequential steps of first microetching and then cleanning provides substrates without nickel plating in through holes that were not designed to be plated without any adverse effects on the appearance of the substrate. Additionally, the use of a thiourea hole conditioning step was avoided.

EXAMPLE 4

Copper laminate printed wiring boards having through holes that were not to be plated were cleaned using a cleaning bath and then contacted with a microetching bath, after which the through holes that were not to be plated were evaluated for immersion gold deposition, using a conventional immersion gold plating bath and standard plating conditions. The cleaning and microetching baths used were as follows.

Cleaning Baths

CB-1; 250 mL/L Acid Cleaner PC
CB-2; 5 mL/L thioglycolic acid, 1 mL/L hydrochloric acid, 250 mL/L Acid Cleaner PC Microetching Baths MB-1; 70 g/L sodium persulfate, 30 mL/L sulfuric acid ("$H_2SO_4$")
MB-2; 20 g/L potassium peroxymonosulfate, 50 g/L sodium persulfate, 30 mL/L $H_2SO_4$
MB-3; 35 g/L potassium peroxymonosulfate, 35 g/L sodium persulfate, 30 mL/L $H_2SO_4$
MB-4; 50 g/L potassium peroxymonosulfate, 20 g/L sodium persulfate, 30 mL/L $H_2SO_4$
MB-5; 70 g/L potassium peroxymonosulfate, 30 mL/L $H_2SO_4$ The boards were contacted with the cleaning bath for 5 minutes at 50° C. and with the microetching bath for 1.5 minutes at 35° C. Acid Cleaner PC is an aqueous acid cleaner available from Shipley Company, L.L.C. After contact with the catalyst bath, the boards were rinsed and then contacted with a conventional electroless nickel bath at 85° C. for 16.5 minutes. The boards were then rinsed again and contacted with a conventional immersion gold bath, Aurolectroless™ SMT, available from the Shipley Company, at 85° for 7.5 minutes, to provide an electroless nickel-immersion gold ("ENIG") deposit as a final finish. The through holes that were not to be plated were visually evaluated for the any immersion gold deposit. The data are reported in Table 4.

TABLE 4

| Sample | Cleaning Bath | Microetching Bath | Gold Immersion |
|---|---|---|---|
| 6 (comparative) | CB-1 | MB-1 | Yes |
| 7 | CB-2 | MB-2 | No |

TABLE 4-continued

| Sample | Cleaning Bath | Microetching Bath | Gold Immersion |
|---|---|---|---|
| 8 | CB-2 | MB-3 | No |
| 9 | CB-2 | MB-4 | No |
| 10 | CB-2 | MB-4 | No |

These data clearly show that the presence of thioglycolic acid effectively prevents unwanted metal plating in through holes.

EXAMPLE 5

The procedure of Example 4 was repeated with the following cleaning and microetching baths. The data are presented in Table 5.

Cleaning Baths
CB-2: 5 mL/L thioglycolic acid, 1 mL/L hydrochloric acid, 250 mL/L Acid Cleaner PC
CB-3: 250 mL/L Acid Cleaner PC, 50 g/L thiourea Microetching Baths
MB-6: 90 g/L sodium persulfate, 10 g/L sodium persulfate, 20 mL/L sulfuric acid ("$H_2SO_4$")
MB-7: 108 g/L potassium peroxymonosulfate, 12 g/L sodium persulfate, 20 mL/L $H_2SO_4$
MB-8: 72 g/L potassium peroxymonosulfate, 8 g/L sodium persulfate, 20 mL/L $H_2SO_4$

TABLE 5

| Sample | Cleaning Bath | Microetching Bath | Gold Immersion |
|---|---|---|---|
| 11 (comparative) | CB-3 | MB-6 | No* |
| 12 | CB-2 | MB-7 | No |
| 13 | CB-2 | MB-6 | No |
| 14 | CB-2 | MB-8 | No |

*precipitate formation in bath

EXAMPLE 6

Copper laminate printed wiring boards having through holes that were not to be plated were cleaned using a cleaning bath and then contacted with a microetching bath, after which the through holes that were not to be plated were evaluated for immersion gold deposition, using a convention electroless nickel plating bath followed by a conventional immersion gold plating bath using standard plating conditions. The cleaning and microetching baths used were as follows.

Cleaning Baths
CB-4: 250 mL/L Acid Cleaner PC
CB-5: 0.15 mL/L thioglycolic acid, 0.4 mL/L hydrochloric acid, 250 mL/L Acid Cleaner PC
CB-6: 0.1 mL/L thioglycolic acid, 0.4 mL/L hydrochloric acid, 250 mL/L Acid Cleaner PC
CB-7: 0.2 mL/L thioglycolic acid, 0.4 mL/L hydrochloric acid, 250 mL/L Acid Cleaner PC Microetching Baths
MB-9: 70 g/L sodium persulfate, 20 mL/L sulfuric acid ("$H_2SO_4$")
MB-10: 100 g/L potassium peroxymonosulfate, 5 g/L 5,5-dimethylhydantoin, 20 mL/L $H_2SO_4$
MB-11: 80 g/L potassium peroxymonosulfate, 5 g/L 5,5-dimethylhydantoin, 20 mL/L $H_2SO_4$
MB-12: 120 g/L potassium peroxymonosulfate, 5 g/L 5,5-dimethylhydantoin, 20 mL/L $H_2SO_4$
MB-13: 100 g/L potassium peroxymonosulfate, 20 mL/L $H_2SO_4$ The boards were contacted with the cleaning bath for 5 minutes at 50° C. and with the microetching bath for 1.5 minutes at 35° C. Acid Cleaner PC is an aqueous acid cleaner available from Shipley Company, L.L.C.

Following contact with the microetching bath, the boards were rinsed, contacted with 10% hydrochloric acid, and then contacted with an electroless nickel catalyst bath, Ronamerse™ SMT Catalyst available from the Shipley Company. After contact with the catalyst bath, the boards were rinsed and then contacted with a conventional electroless nickel bath at 85° C. for 16.5 minutes. The boards were then rinsed again and contacted with a conventional immersion gold bath, Aurolectroless™ SMT, available from the Shipley Company, at 85° for 7.5 minutes, to provide an electroless nickel-immersion gold ("ENIG") deposit as a final finish. The through holes that were not to be plated were visually evaluated for the any immersion gold deposit and the final finish appearance was visually evaluated. The data are reported in Table 6.

TABLE 6

| Sample | Cleaning Bath | Microetching Bath | Gold Immersion | Final ENIG Deposit Appearance |
|---|---|---|---|---|
| 15 (comparative) | CB-4 | MB-9 | Yes | Even and matte |
| 16 | CB-5 | MB-10 | No | Even and Bright |
| 17 | CB-6 | MB-11 | No | " |
| 18 | CB-7 | MB-12 | No | " |
| 19 | CB-6 | MB-12 | No | " |
| 20 | CB-7 | MB-11 | No | " |
| 21 (comparative) | CB-7 | MB-13 | No | Unven and matte |

These data clearly show that the presence of dimethylhydantoin effectively provides an even and bright ENIG final finish.

EXAMPLE 7

Copper laminate printed wiring board test coupons containing a soldermask and having through holes that were not to be plated were heat treated at 140° C. for 2 hours. After heat treating, the test coupons were cleaned using a cleaning bath and then contacted with a microetching bath, after which the through holes that were not to be plated were evaluated for immersion gold deposition, using a convention electroless nickel plating bath followed by a conventional immersion gold plating bath using standard plating conditions. The cleaning bath contained 250 mL/L Acid Cleaner PC, 0.15 mL/L thioglycolic acid, 5 g/L thiourea and 0.4 g/L polyethylene glycol-(4-nonylphenyl)-(3-sulfopropyl)-diether, potassium salt.

The microetching baths used were those reported in Table 7.

TABLE 7

| Microetch Bath | H$_2$SO$_4$ (mL/L) | Potassium Peroxymonosulfate (g/L) | Sodium Persulfate (g/L) | Complexing Agent |
|---|---|---|---|---|
| A | 20 | 63 | 7 | 2.1 mL/L - phenolsulfonic acid |
| B | 20 | 63 | 7 | 1.5 mL/L - phenolsulfonic acid |
| C | 20 | 63 | 7 | 2.7 mL/L - phenolsulfonic acid |
| D | 20 | 45 | 5 | 2.1 mL/L - phenolsulfonic acid |
| E | 20 | 45 | 5 | 1.5 mL/L - phenolsulfonic acid |
| F | 20 | 45 | 5 | 2.7 mL/L - phenolsulfonic acid |
| G | 20 | 81 | 9 | 2.1 mL/L - phenolsulfonic acid |
| H | 20 | 81 | 9 | 1.5 mL/L - phenolsulfonic acid |
| I | 20 | 81 | 9 | 2.7 mL/L - phenolsulfonic acid |
| J | 10 | 40.5 | 4.5 | 0.3 mL/L - phenolsulfonic acid |
| K | 5 | 31.5 | 3.5 | 0.3 mL/L - phenolsulfonic acid |
| L | 10 | 31.5 | 3.5 | 0.3 mL/L - phenolsulfonic acid |
| M | 5 | 31.5 | 3.5 | 1.05 mL/L - phenolsulfonic acid |
| N | 7.5 | 36 | 4 | 1.2 mL/L - phenolsulfonic acid |
| O | 7.5 | 45 | 5 | 1.2 mL/L - phenolsulfonic acid |
| P | 7.5 | 54 | 6 | 1.2 mL/L - phenolsulfonic acid |
| Q | 7.5 | 63 | 7 | 1.2 mL/L - phenolsulfonic acid |
| R | 7.5 | 72 | 8 | 1.2 mL/L - phenolsulfonic acid |
| S | 2.5 | 45 | 5 | 1.2 mL/L - phenolsulfonic acid |
| T | 7.5 | 63 | 7 | 2.5 g/L - dimethyl hydantoin |
| U | 7.5 | 63 | 7 | 0.25 g/L - dimethyl hydantoin |
| V | 7.5 | 63 | 7 | 0.025 g/L - dimethyl hydantoin |
| W | 7.5 | 63 | 7 | 0.05 g/L - dimethyl hydantoin |
| X | 7.5 | 63 | 7 | 0.125 g/L - dimethyl hydantoin |

The boards were contacted with the cleaning bath for 5 minutes at 50° C. and with the microetching bath for 1.5 minutes at 35° C. Acid Cleaner PC is an aqueous acid cleaner available from Shipley Company, L.L.C.

Following contact with the microetching bath, the boards were rinsed, contacted with 10% hydrochloric acid, and then contacted with an electroless nickel catalyst bath, Ronamerse™ SMT Catalyst available from the Shipley Company. After contact with the catalyst bath, the boards were rinsed and then contacted with a conventional electroless nickel bath at 85° C. for 16.5 minutes. The boards were then rinsed again and contacted with a conventional immersion gold bath, Aurolectroless™ SMT, available from the Shipley Company, at 85° C. for 7.5 minutes, to provide an electroless nickel-immersion gold ("ENIG") deposit as a final finish. The through holes that were not to be plated were visually evaluated for the any immersion gold deposit and the final finish appearance was visually evaluated. The data are reported in Table 8.

The etch rate of the exposed copper features was also determined and is reported in Table 8 in microinches (1 microinch=0.025 μm).

TABLE 8

| No. | Microetch | ENIG Appearance | Etch Rate (microinch) |
|---|---|---|---|
| 1 | A | Even and matte | 77.82 |
| 2 | B | Even and matte | 80.11 |
| 3 | C | Even and matte | 70.78 |
| 4 | D | Even and matte | 69.32 |
| 5 | E | Even and matte | 78.78 |
| 6 | F | Even and matte | 66.17 |
| 7 | G | Even and matte | 83.44 |
| 8 | H | Even and matte | 80.11 |
| 9 | I | Even and matte | 83.26 |
| 10 | J | Even and matte | 52.2 |
| 11 | K | Even and matte | |
| 12 | L | Even and matte | |
| 13 | M | Even and matte | |
| 14 | N | Even and matte | 53.2 |
| 15 | O | Even and matte | 54.7 |
| 16 | P | Even and matte | 58.3 |
| 17 | Q | Even and matte | 64.3 |
| 18 | R | Even and matte | 84.8 |
| 19 | S | Even and matte | 48.8 |
| 20 | T | Not even | 35.7 |
| 21 | U | Even and bright | 40.9 |
| 22 | V | Not even and slightly matte | |
| 23 | W | Not even and slightly matte | 75.9 |
| 24 | X | Even and slightly matte | 56.8 |

These data clearly show that the presence of dimethylhydantoin effectively provides an even and bright ENIG final finish and the presence of phenolsulfonic acid provides an even and matte ENIG final finish.

What is claimed is:

1. A method for manufacturing a printed wiring board comprising the steps of:
   a) providing a circuitized printed wiring board substrate having through holes wherein a portion of the through holes are not to be metal plated;
   b) subjecting the printed wiring board substrate to the sequential steps of:
      (i) contacting the printed wiring board substrate with a cleaning bath comprising one or more organic sulfur compounds containing a divalent sulfur atom having a carbon-sulfur single bond; and
      (ii) contacting the cleaned printed wiring board substrate with a microetching bath; and
   c) electrolessly depositing a metal layer on the printed wiring board substrate;

wherein the through holes not to be metal plated are substantially free of the electrolessly deposited metal layer.

2. The method of claim 1 wherein the microetching bath comprises: one or more oxidants, and water.

3. The method of claim 1 wherein the metal layer is selected from the group consisting of copper, palladium, nickel, silver and alloys and mixtures thereof.

4. The method of claim 1 further comprising the step of depositing a second metal layer on the electrolessly deposited metal layer.

5. The method of claim 1 wherein the cleaning bath further comprises thiourea.

6. The method of claim 1 wherein the one or more organic sulfur compounds are selected from the group consisting of thiol-substituted organic compounds, thioethers, and disulfides.

7. The method of claim 6 wherein the one or more organic sulfur compounds are selected from the group consisting of thiol-substituted alkane carboxylic acids, thiol-substituted alkanes and alkenes, dialkyl- and diaryl-thioethers, and dialkyl- and diaryl-disulfides.

8. The method of claim 1 wherein the organic sulfur compound is selected from the group consisting of thioglycolic acid, thiomalic acid, penicillamine, mercaptobenzothiazole, mercaptotriazole, mercaptopyridine, mercaptobenzene, and mercaptotoluene.

9. A method of reducing electroless metal deposition in through holes that are not to be plated comprising the steps of:
   a) providing a circuitized printed wiring board substrate having through holes wherein a portion of the through holes are not to be metal plated;
   b) subjecting the printed wiring board substrate to the sequential steps of:
      (i) contacting the printed wiring board substrate with a cleaning bath comprising one or more organic sulfur compounds containing a divalent sulfur atom having a carbon-sulfur single bond; and
      (ii) contacting the cleaned printed wiring board substrate with a microetching bath; and
   c) electrolessly depositing a metal layer on the printed wiring board substrate;
   wherein the through holes not to be metal plated are substantially free of the electrolessly deposited metal layer.

10. A composition for cleaning through holes that are designed not to be plated comprising water, one or more surfactants, one or more organic sulfur compounds containing a divalent sulfur atom having a carbon-sulfur single bond, and optionally one or more chelating agents.

11. A method for manufacturing a printed wiring board comprising the steps of:
   a) providing a circuitized printed wiring board substrate having through holes wherein a portion of the through holes are not to be metal plated;
   b) subjecting the printed wiring board substrate to the sequential steps of:
      (i) contacting the printed wiring board substrate with a first microetching bath to provide a microetched printed wiring board substrate;
      (ii) contacting the microetched printed wiring board substrate with a cleaning bath; and
      (iii) contacting the cleaned and microetched printed wiring board substrate with a second microetching bath; and
   c) electrolessly depositing a metal layer on the printed wiring board substrate;
   wherein the through holes not to be metal plated are substantially free of the electrolessly deposited metal layer and wherein step b) is performed without a hole conditioning step.

12. A method for manufacturing a printed wiring board comprising the steps of: a) providing a printed wiring board substrate having a portion of which is to be electrolessly plated with a metal layer; b) contacting the printed wiring board substrate with a cleaning bath comprising one or more organic sulfur compounds containing a divalent sulfur atom having a carbon-sulfur single bond; c) contacting the printed wiring board substrate with a microetching bath prior to electroless metal plating; and d) contacting the printed wiring board substrate with an electroless metal plating bath to deposit a metal layer; wherein the microetching bath comprises one or more complexing agents selected from hydantoin compounds, organic sulfonic acids and mixtures thereof.

13. The method of claim 12 wherein the microetching bath further comprises: one or more oxidants, and water.

14. The method of claim 12 wherein the one or more hydantoin compounds are selected from the group consisting of hydantoin; mono($C_1$–$C_{10}$)alkylhydantoins; di($C_1$–$C_{10}$) alkylhydantoins and ($C_6$–$C_{10}$)arylhydantoins.

15. The method of claim 12 wherein the metal layer is selected from the group consisting of copper, palladium, nickel, silver and alloys and mixtures thereof.

16. A method for manufacturing a printed wiring board comprising the steps of:
   a) providing a circuitized printed wiring board substrate having through holes wherein a portion of the through holes are not to be metal plated;
   b) subjecting the printed wiring board substrate to the sequential steps of:
      (i) contacting the printed wiring board substrate with a cleaning bath; and
      (ii) contacting the cleaned printed wiring board substrate with a microetching bath; and
   c) electrolessly depositing a metal layer on the printed wiring board substrate;
   wherein the cleaning bath comprises one or more organic sulfur compounds containing a divalent sulfur atom having a carbon-sulfur single bond; and wherein the microetching bath comprises one or more complexing agents selected from hydantoin compounds, organic sulfonic acids and mixtures thereof; and wherein the through holes not to be metal plated are substantially free of the electrolessly deposited metal layer.

17. The method of claim 16 wherein the one or more organic sulfur compounds are selected from the group consisting of thiol-substituted organic compounds, thioethers, and di sulfides.

18. The method of claim 16 wherein the organic sulfur compound is selected from the group consisting of thioglycolic acid, thiomalic acid, penicillamine, mercaptobenzothiazole, mercaptotriazole, mercaptopyridine, mercaptobenzene, and mercaptotoluene.

19. The method of claim 16 wherein the one or more hydantoin compounds are selected from the group consisting of hydantoin; mono($C_1$–$C_{10}$)alkylhydantoins; di($C_1$–$C_{10}$) alkylhydantoins and ($C_6$–$C_{10}$)arylhydantoins.

20. The method of claim 16 wherein the cleaning bath further comprises thiourea.

* * * * *